US012119687B2

(12) United States Patent
Yang et al.

(10) Patent No.: US 12,119,687 B2
(45) Date of Patent: Oct. 15, 2024

(54) BATTERY PACK INCLUDING PLURALITY OF CURRENT PATHS

(71) Applicant: LG Energy Solution, Ltd., Seoul (KR)

(72) Inventors: Seung-Min Yang, Daejeon (KR); Hyo-Seong An, Daejeon (KR); Hyung-Kuk Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 464 days.

(21) Appl. No.: 17/629,056

(22) PCT Filed: Dec. 3, 2020

(86) PCT No.: PCT/KR2020/017564
§ 371 (c)(1),
(2) Date: Jan. 21, 2022

(87) PCT Pub. No.: WO2021/112595
PCT Pub. Date: Jun. 10, 2021

(65) Prior Publication Data

US 2022/0276315 A1 Sep. 1, 2022

(30) Foreign Application Priority Data

Dec. 5, 2019 (KR) ........................ 10-2019-0160935

(51) Int. Cl.
*H02J 7/00* (2006.01)
*H01M 10/42* (2006.01)
(Continued)

(52) U.S. Cl.
CPC ......... *H02J 7/0031* (2013.01); *H01M 10/425* (2013.01); *H02J 7/0063* (2013.01);
(Continued)

(58) Field of Classification Search
CPC ........ H02J 7/0031; H02J 7/0063; H02J 7/007; H01M 10/425; H01M 10/482; G01R 31/3842
(Continued)

(56) References Cited

U.S. PATENT DOCUMENTS 5,352,932 A 10/1994 Tihanyi
5,867,008 A 2/1999 Du et al.
(Continued)

FOREIGN PATENT DOCUMENTS

CN 1507089 A 6/2004
CN 1665059 A 9/2005
(Continued)

OTHER PUBLICATIONS

Office Action dated Mar. 4, 2023, issued in corresponding Chinese Patent Application No. 202080048318.0.
(Continued)

*Primary Examiner* — Edward Tso
*Assistant Examiner* — Aaron Piggush
(74) *Attorney, Agent, or Firm* — Morgan, Lewis & Bockius LLP

(57) ABSTRACT

The present disclosure is directed to providing a battery pack, which may output a current that satisfies the operating specifications of a load even over a wide voltage range by including a plurality of current paths. In addition, according to an aspect of the present disclosure, since a current path corresponding to an input voltage range is automatically selected, there is an advantage of providing a battery pack compatible with an input of a wide voltage range.

11 Claims, 4 Drawing Sheets

(51) Int. Cl.
*G01R 31/3842* (2019.01)
*H01M 10/48* (2006.01)

(52) U.S. Cl.
CPC .......... *H02J 7/007* (2013.01); *G01R 31/3842* (2019.01); *H01M 10/482* (2013.01)

(58) Field of Classification Search
USPC .......................... 320/112, 134, 136, 163, 164
See application file for complete search history.

(56) References Cited

U.S. PATENT DOCUMENTS

| | | | |
|---|---|---|---|
| 2002/0017896 | A1 | 2/2002 | Hogari et al. |
| 2004/0109274 | A1 | 6/2004 | Sato |
| 2005/0156574 | A1 | 7/2005 | Sato et al. |
| 2008/0158755 | A1 | 7/2008 | Sato |
| 2009/0051323 | A1 | 2/2009 | Sato et al. |
| 2010/0176764 | A1 | 7/2010 | Tachikawa et al. |
| 2010/0315044 | A1* | 12/2010 | Sunderlin ........... H01M 10/425 320/136 |
| 2011/0043170 | A1 | 2/2011 | Kim et al. |
| 2013/0221924 | A1* | 8/2013 | Sim ....................... H02J 7/0063 320/112 |
| 2014/0210612 | A1 | 7/2014 | Shibata |
| 2017/0018944 | A1 | 1/2017 | Yoshioka et al. |
| 2017/0250549 | A1* | 8/2017 | Jin ........................ H02J 7/0031 |
| 2019/0097277 | A1 | 3/2019 | Fukae |
| 2019/0158027 | A1 | 5/2019 | Williams |
| 2019/0324091 | A1 | 10/2019 | Sato |
| 2020/0052346 | A1 | 2/2020 | Park |

FOREIGN PATENT DOCUMENTS

| | | | |
|---|---|---|---|
| CN | 102625961 | A | 8/2012 |
| CN | 106786817 | A | 5/2017 |
| EP | 0 572 706 | A1 | 12/1993 |
| JP | 2001-351697 | A | 12/2001 |
| JP | 2001-352665 | A | 12/2001 |
| JP | 2017-200306 | A | 11/2017 |
| JP | 2018-093679 | A | 6/2018 |
| KR | 10-1030885 | B1 | 4/2011 |
| KR | 10-2012-0036859 | A | 4/2012 |
| KR | 10-2013-0098680 | A | 9/2013 |
| KR | 10-2014-0098668 | A | 8/2014 |
| KR | 10-2017-0094689 | A | 8/2017 |
| KR | 10-2018-0049899 | A | 5/2018 |
| KR | 10-2019-0051477 | A | 5/2019 |
| KR | 10-2019-0057006 | A | 5/2019 |
| KR | 10-2019-0120653 | A | 10/2019 |

OTHER PUBLICATIONS

International Search Report issued in corresponding International Patent Application No. PCT/KR2020/017564 dated Apr. 1, 2021.
Extended European Search Report dated Nov. 7, 2022, issued by the European Patent Office in corresponding European Patent Application No. 20895998.1.

* cited by examiner

BATTERY PACK INCLUDING PLURALITY OF CURRENT PATHS

TECHNICAL FIELD

The present application claims priority to Korean Patent Application No. 10-2019-0160935 filed on Dec. 5, 2019 in the Republic of Korea, the disclosures of which are incorporated herein by reference.

The present disclosure relates to a battery pack, and more particularly, to a battery pack including a plurality of current paths.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-discharging rate and high energy density.

Meanwhile, such a battery is included in a battery pack and is provided to various devices. In this case, if the battery pack is operated at all times, a current may be consumed uselessly. Accordingly, there is an increasing tendency to design a battery pack so that the battery pack is operated in a wake-up mode only when a wake-up signal is input.

In general, if an input wake-up signal is small, the wake-up signal may be input by reverting an external power or a battery voltage. In this case, if a single current path is included in the battery pack, as the voltage range of the input signal is widened, it may be difficult to satisfy the operating specifications of a load provided to the battery pack.

DISCLOSURE

Technical Problem

The present disclosure is designed to solve the problems of the related art, and therefore the present disclosure is directed to providing a battery pack, which may output a current that satisfies the operating specifications of a load even over a wide voltage range by including a plurality of current paths.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery pack including a plurality of current paths, comprising: a battery module configured to have one or more battery cells; a diode disposed so that a direction toward a positive electrode of the battery module is a positive direction, the diode being connected in parallel with the battery module; a FET (Field Effect Transistor) having a gate terminal, a drain terminal and a source terminal, connected in parallel with the diode through the drain terminal and the source terminal and connected to the other end of the diode through the gate terminal, the FET being configured to receive an operation voltage from the battery module through the diode; a first transistor having a first base terminal, a first emitter terminal and a first collector terminal and configured so that the first base terminal is connected to the drain terminal and so that the first emitter terminal and the first collector terminal are connected to a positive electrode terminal of the battery module; and a second transistor having a second base terminal, a second emitter terminal and a second collector terminal and configured so that the second base terminal is connected between the drain terminal and the first base terminal, the second collector terminal is connected to the first emitter terminal to be disposed between the first emitter terminal and the first collector terminal, and the second emitter terminal is connected to the first collector terminal.

The first transistor may be configured so that the first emitter terminal is connected between the positive electrode terminal of the battery module and the second collector terminal of the second transistor.

The diode may be configured to conduct electricity when a voltage equal to or greater than a reference voltage is applied thereto from the battery module.

The FET may be configured so that an operation state thereof is shifted to a turn-on state only when a voltage equal to or greater than the reference voltage is applied to the diode.

The second transistor may be configured so that the second emitter terminal and the second collector terminal conduct electricity only when the voltage of the battery module is smaller than the reference voltage.

A battery pack according to another aspect of the present disclosure may further comprise a first resistor disposed between the diode and a negative electrode terminal of the battery module.

The FET may be configured so that the gate terminal is connected between the first resistor and the diode.

A battery pack according to still another aspect of the present disclosure may further comprise a second resistor disposed between the diode and the drain terminal of the FET.

The second transistor may be configured so that the second collector terminal is connected between the diode and the second resistor.

A battery pack according to still another aspect of the present disclosure may further comprise a third resistor disposed between the second resistor and the first base terminal of the first transistor.

The FET may be configured so that the drain terminal is connected between the second resistor and the third resistor.

The second transistor may be configured so that the second base terminal is connected between the drain terminal and the third resistor.

A battery pack according to still another aspect of the present disclosure may further comprise a fourth resistor disposed between the first collector terminal of the first transistor and a positive electrode terminal of the battery pack; and a fifth resistor having a smaller resistance than the fourth resistor and disposed between the second emitter terminal of the second transistor and the positive electrode terminal of the battery pack.

A battery pack according to still another aspect of the present disclosure may further comprise a main relay configured to be connected in series to one end of the battery module; a measuring unit configured to measure a voltage of the battery module, measure a current flowing between the diode and the FET, and output the measured voltage and current values; and a control unit configured to receive the measured voltage and current values from the measuring unit and control an operation state of the main relay based on the received voltage and current values.

The control unit may be configured to calculate a power consumption of the diode based on the received voltage and current values and control the operation state of the main relay to a turn-off state when the calculated power consumption is equal to or greater than a maximum allowable power of the diode.

The control unit may be configured to block the electric connection between the battery pack and the battery module by controlling the operation state of the main relay to a turn-off state.

Advantageous Effects

According to an aspect of the present disclosure, since the battery pack includes a plurality of current paths, there is an advantage that a current may flow through a path corresponding to a voltage of a battery module. Therefore, the battery pack has an advantage of minimizing damage to internal elements of the battery pack even when the voltage range of the battery module is changed.

In addition, since the battery pack may apply a constant voltage and current to a load through a plurality of current paths, there is an advantage of preventing the load from being damaged due to application of overvoltage and overcurrent.

In addition, according to an aspect of the present disclosure, since a current path corresponding to an input voltage range is automatically selected, there is an advantage of providing a battery pack compatible with an input of a wide voltage range.

The effects of the present disclosure are not limited to the above, and other effects not mentioned herein will be clearly understood by those skilled in the art from the appended claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as “first”, “second” and the like, may be used to distinguish one element from another among various elements, but not intended to limit the elements by the terms.

Throughout the specification, when a portion is referred to as “comprising” or “including” any element, it means that the portion may include other elements further, without excluding other elements, unless specifically stated otherwise.

Furthermore, the term “control unit” described in the specification refers to a unit that processes at least one function or operation, and may be implemented by hardware, software, or a combination of hardware and software.

In addition, throughout the specification, when a portion is referred to as being “connected” to another portion, it is not limited to the case that they are “directly connected”, but it also includes the case where they are “indirectly connected” with another element being interposed between them.

Hereinafter, a preferred embodiment of the present disclosure will be described in detail with reference to the accompanying drawings.

Figure 1:
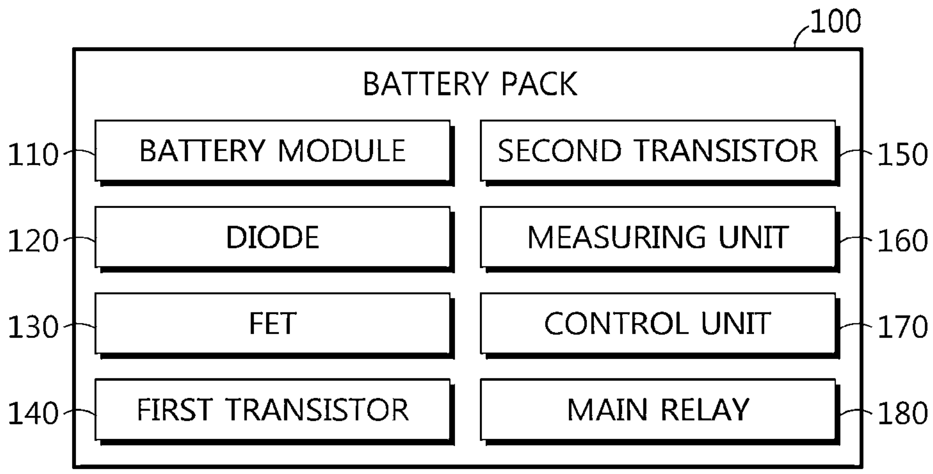
FIG. 1 is a diagram schematically showing a battery pack according to an embodiment of the present disclosure.
Figure 2:
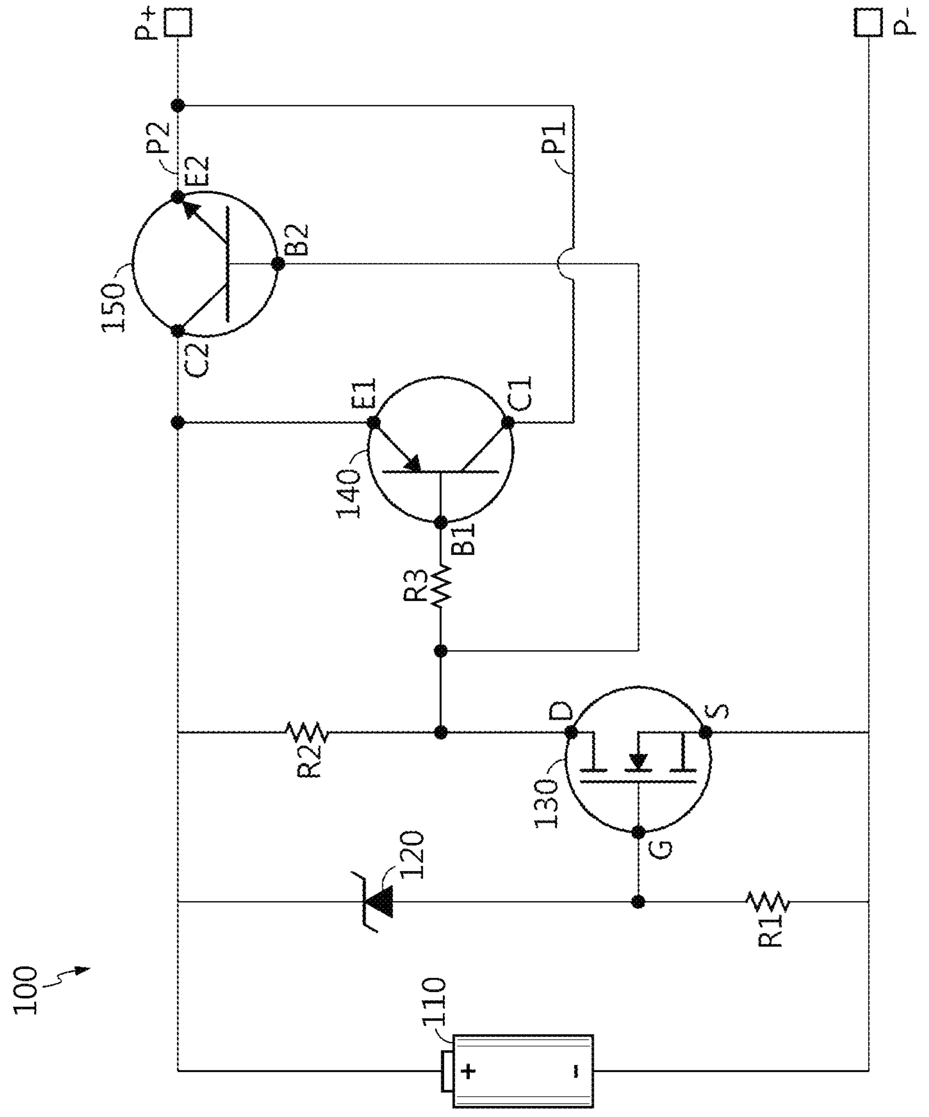
FIG. 2 is a diagram schematically showing an exemplary configuration of the battery pack according to an embodiment of the present disclosure.

FIG. 1 is a diagram schematically showing a battery pack according to an embodiment of the present disclosure. FIG. 2 is a diagram schematically showing an exemplary configuration of the battery pack according to an embodiment of the present disclosure.

Referring to FIGS. 1 and 2, a battery pack 100 according to an embodiment of the present disclosure includes a battery module 110, a diode 120, a FET (Field Effect Transistor) 130, a first transistor 140, and a second transistor 150.

Here, the battery module 110 may include one or more battery cells connected in series and/or in parallel. In addition, the battery cell means one independent cell that has a negative electrode terminal and a positive electrode terminal and is physically separable. For example, one pouch-type lithium polymer cell may be regarded as the battery cell.

The battery module 110 may output a wide range of voltages according to a connection relationship among a plurality of battery cells included therein. For example, according to a serial and/or parallel connection relationship of the plurality of battery cells included in the battery module 110, the magnitude of an output voltage of the battery module 110 may vary.

The diode 120 may be configured so that a direction toward a positive electrode of the battery module 110 is a positive direction. Hereinafter, for convenience of explanation, it will be described that one end of the diode 120 is a terminal at a positive electrode of the battery module 110, and the other end of the diode 120 is a terminal at a negative electrode of the battery module 110.

Here, the positive direction of the diode 120 is a direction from the other end of the diode 120 toward one end thereof, and may be a direction toward the positive electrode of the battery module 110. That is, the diode 120 may be configured to block the current output from the positive electrode terminal of the battery module 110.

The diode 120 may be configured to be connected in parallel with the battery module 110.

Specifically, one end of the diode 120 may be connected to the positive electrode terminal of the battery module 110, and the other end of the diode 120 may be connected to the negative electrode terminal of the battery module 110. In addition, the positive direction of the diode 120 may be a direction from the other end of the diode 120 toward one end thereof.

For example, in the embodiment of FIG. 2, the diode 120 may be connected in parallel with the battery module 110. One end of the diode 120 may be connected between the positive electrode terminal of the battery module 110 and a positive electrode terminal P+ of the battery pack 100. In addition, the other end of the diode 120 may be connected between the negative electrode terminal of the battery module 110 and a negative electrode terminal P− of the battery pack 100. Therefore, the diode 120 may be connected in parallel with the battery module 110.

The FET 130 may be configured to include a gate terminal G, a drain terminal D, and a source terminal S.

Preferably, the FET 130 may be a metal-oxide semiconductor field effect transistor (MOSFET). More preferably, the FET 130 may be an N-channel MOSFET. In the N-channel MOSFET, when a voltage applied to the gate terminal G is greater than a voltage applied to the source terminal S, the drain terminal D and the source terminal S may conduct electricity. At this time, a current may flow from the drain terminal D to the source terminal S. For example, in the embodiment of FIG. 2, the FET 130 is an N-channel MOSFET.

The FET 130 may be configured to be connected in parallel with the diode 120 through the drain terminal D and the source terminal S.

Any one of the drain terminal D and the source terminal S of the FET 130 may be connected to any one of one end and the other end of the diode 120, respectively. That is, the drain terminal D and the source terminal S of the FET 130 may be connected in parallel with the diode 120.

For example, in the embodiment of FIG. 2, the drain terminal D of the FET 130 may be connected to one end of the diode 120. Specifically, the drain terminal D of the FET 130 may be connected between one end of the diode 120 and the positive electrode terminal of the battery module 110. In addition, the source terminal S of the FET 130 may be connected to the other end of the diode 120. Specifically, the source terminal S of the FET 130 may be connected between the other end of the diode 120 and the negative electrode terminal of the battery module 110.

In other words, one end of the diode 120 may be considered to be connected between the positive electrode terminal of the battery module 110 and the drain terminal D of the FET 130. In addition, the other end of the diode 120 may be considered to be connected between the negative electrode terminal of the battery module 110 and the source terminal S of the FET 130.

In addition, the FET 130 may be configured to be connected to the other end of the diode 120 through the gate terminal G.

For example, in the embodiment of FIG. 2, the gate terminal G of the FET 130 may be connected between the other end of the diode 120 and the negative electrode terminal of the battery module 110. That is, the gate terminal G of the FET 130 may be connected to a reverse side of the diode 120.

The FET 130 may be configured to receive an operation voltage from the battery module 110 through the diode 120.

Specifically, the diode 120 may be configured to conduct electricity when a voltage equal to or greater than a reference voltage is applied from the battery module 110.

Preferably, the diode 120 may be a Zener diode. Here, the Zener diode is a diode 120 through which a current may pass in a positive direction but a current may pass in a reverse direction only when a voltage equal to or greater than the reference voltage is applied. In this case, the reference voltage may be a breakdown voltage of the Zener diode. That is, if a voltage equal to or greater than the reference voltage is applied in a reverse direction of the Zener diode, a current may flow in a reverse direction of the Zener diode.

The first transistor 140 may be configured to include a first base terminal B1, a first emitter terminal E1, and a first collector terminal C1. In addition, the first base terminal B1 may be a terminal connected to the base of the first transistor 140, the first emitter terminal E1 may be a terminal connected to the emitter of the first transistor 140, and the first collector terminal C1 may be a terminal connected to the collector of the first transistor 140.

Preferably, the first transistor 140 may be a bipolar junction transistor (BJT). More preferably, the first transistor 140 may be a PNP BJT. Here, the PNP BJT may be a transistor in which an emitter and a collector are composed in a P type and a base is composed in an N type. Therefore, if a current is applied to the first base terminal B1 and the first emitter terminal E1, the current may flow from the first emitter terminal E1 toward the first collector terminal C1.

The first transistor 140 may be configured so that the first base terminal B1 is connected to the drain terminal D.

For example, in the embodiment of FIG. 2, the first base terminal B1 of the first transistor 140 may conduct electricity to the drain terminal D of the FET 130. That is, the first base terminal B1 may be connected between the drain terminal D of the FET 130 and one end of the diode 120.

In addition, the first transistor 140 may be configured so that the first emitter terminal E1 and the first collector terminal C1 are connected to the positive electrode terminal side of the battery module 110.

For example, in the embodiment of FIG. 2, the first emitter terminal E1 and the first collector terminal C1 may be connected between the positive electrode terminal of the battery module 110 and the positive electrode terminal P+ of the battery pack 100. Preferably, the first collector terminal C1 may be connected between the first emitter terminal E1 and the positive electrode terminal P+ of the battery pack 100, and the first emitter terminal E1 may be connected between the positive electrode terminal of the battery module 110 and the first collector terminal C1.

The second transistor 150 may be configured to include a second base terminal B2, a second emitter terminal E2, and a second collector terminal C2. Here, the second base terminal B2 may be a terminal connected to the base of the second transistor 150, the second emitter terminal E2 may be a terminal connected to the emitter of the second transistor 150, and the second collector terminal C2 may be a terminal connected to the collector of the second transistor 150.

Preferably, the second transistor 150 may be a bipolar junction transistor (BJT). More preferably, the second transistor 150 may be an NPN BJT. Here, the NPN BJT may be a transistor in which an emitter and a collector are composed in an N type and a base is composed in a P type. That is, the first transistor 140 and the second transistor 150 may be transistors having different polarities. Therefore, if a current is applied to the second base terminal B2 and the second collector terminal C2, the current may flow from the first emitter terminal E1 toward the first collector terminal C1.

In the second transistor 150, the second base terminal B2 may be connected between the drain terminal D and the first base terminal B1.

For example, in the embodiment of FIG. 2, the second base terminal B2 of the second transistor 150 may conduct electricity between the drain terminal D of the FET 130 and the first base terminal B1 of the first transistor 140.

In addition, the second transistor 150 may be configured to be disposed between the first emitter terminal E1 and the first collector terminal C1.

Preferably, since the second base terminal B2 of the second transistor 150 is connected between the drain terminal D of the FET 130 and the first base terminal B1 of the first transistor 140, the second emitter terminal E2 and the second collector terminal C2 may be connected between the first emitter terminal E1 and the first collector terminal C1. More preferably, the second collector terminal C2 may be configured to be connected to the first emitter terminal E1, and the second emitter terminal E2 may be configured to be connected to the first collector terminal C1.

For example, in the embodiment of FIG. 2, the first emitter terminal E1 and the second collector terminal C2 may conduct electricity to each other, and the first collector terminal C1 and the second emitter terminal E2 may conduct electricity to each other. That is, the emitter of the first transistor 140 and the collector of the second transistor 150 may be connected, and the collector of the first transistor 140 and the emitter of the second transistor 150 may be connected.

In addition, the first transistor 140 may be configured so that the first emitter terminal E1 is connected between the positive electrode terminal of the battery module 110 and the second collector terminal C2 of the second transistor 150.

For example, referring to the embodiment of FIG. 2, the first emitter terminal E1 may be connected between the positive electrode terminal of the battery module 110 and the second collector terminal C2 of the second transistor 150, and the first collector terminal C1 may be connected between the positive electrode terminal P+ of the battery pack 100 and the second emitter terminal E2 of the second transistor 150.

In the embodiment of FIG. 2, a line between the first collector terminal C1 of the first transistor 140 and the positive electrode terminal P+ of the battery pack 100 is a first current path P1, and a line between the second emitter terminal E2 of the second transistor 150 and the positive electrode terminal P+ of the battery pack 100 is a second current path P2.

The battery pack 100 according to an embodiment of the present disclosure includes a plurality of current paths, and the plurality of current paths may include the first current path P1 and the second current path P2. If a load is connected to the battery pack 100, the current output from the battery module 110 may flow through at least one of the first current path P1 and the second current path P2 according to the voltage of the battery module 110. More specifically, according to the magnitude of the voltage applied to the diode 120, the current output from the battery module 110 may flow through at least one of the first current path P1 and the second current path P2.

That is, since the battery pack 100 according to an embodiment of the present disclosure includes a plurality of current paths, there is an advantage in that a current may flow through a path corresponding to the voltage of the battery module 110. Therefore, the battery pack 100 has an advantage of minimizing damage to internal elements of the battery pack 100 even if the voltage range of the battery module 110 is changed. In addition, since the battery pack 100 may apply constant voltage and current to the load through the plurality of current paths, there is an advantage of preventing the load from being damaged due to application of overvoltage and overcurrent.

First, the voltage applied to the diode 120 and the operation state of the FET 130 will be described. Specifically, a current path through which the current output from the battery module 110 may flow may vary depending on the operation state of the FET 130. Therefore, the voltage applied to the diode 120 and the operation state of the FET 130 will be first described, and then the current path will be described later. In addition, hereinafter, it is assumed that a load is connected to the positive electrode terminal P+ of the battery pack 100 and the negative electrode terminal P− of the battery pack 100, and the load is charged by the battery module 110.

The FET 130 may be configured so that its operation state is shifted to a turn-on state only when a voltage equal to or greater than the reference voltage is applied to the diode 120.

As described above, the FET 130 may be an N-channel MOSFET. Therefore, the operation state of the FET 130 may be shifted to a turn-on state only when the voltage applied to the gate terminal G is greater than the voltage applied to the source terminal S by a predetermined voltage magnitude or above.

More specifically, the operation state of the FET 130 may be shifted to a turn-on state only when the gate voltage (a difference between the voltage applied to the gate terminal G and the voltage applied to the source terminal S) is greater than or equal to a predetermined voltage magnitude. For example, assuming that the source terminal S of the FET 130 is connected to the ground at the negative electrode of the battery module 110, if a voltage equal to or greater than the predetermined voltage magnitude is applied to the gate terminal G of the FET 130, the operation state of the FET 130 may be shifted to a turn-on state.

Referring to FIG. 2, since the gate terminal G of the FET 130 is connected to the other end of the diode 120, a voltage may be applied to the gate terminal G only when a current flows in a reverse direction of the diode 120. That is, only when the voltage of the battery module 110 is equal to or greater than the reference voltage, the current output from the battery module 110 may flow in a reverse direction of the diode 120. Therefore, since the gate terminal G of the FET 130 may receive a voltage only when the voltage of the battery module 110 is equal to or greater than the reference voltage (the breakdown voltage of the diode 120), the operation state of FET 130 may be shifted to a turn-on state only in this case.

For example, in the embodiment of FIG. 2, if the operation state of the FET 130 is shifted to a turn-on state, the drain terminal D and the source terminal S of the FET 130 may conduct electricity. In addition, a current may flow from the drain terminal D of the FET 130 to the source terminal S.

In summary, the operation state of the FET 130 is a turn-off state if the voltage applied to the diode 120 (the voltage of the battery module 110) is smaller than the reference voltage and is a turn-on state if the voltage applied to the diode 120 is equal to or greater than the reference voltage.

Hereinafter, an embodiment in which a current path through which the current output from the battery module 110 flows is selected according to a voltage applied to the diode 120 will be described.

First, a case where the voltage applied to the diode 120 is smaller than the reference voltage will be described.

If the voltage applied to the diode 120, namely the voltage of the battery module 110, is smaller than the reference voltage, a current may not flow in a reverse direction of the diode 120. In this case, the operation state of the FET 130 may be a turn-off state.

In addition, the current output from the battery module 110 may be applied to the first base terminal B1, the first emitter terminal E1, the second collector terminal C2 and the second base terminal B2. That is, the emitters and the collectors of the first transistor 140 and the second transistor 150 may conduct electricity.

For example, in the embodiment of FIG. 2, in the first transistor 140, a current may flow from the first emitter terminal E1 toward the first collector terminal C1, and in the second transistor 150, a current may flow from the second collector terminal C2 toward the second emitter terminal E2.

That is, if the voltage applied to the diode 120 is smaller than the reference voltage, the current output from the battery module 110 may flow through the first current path P1 and the second current path P2.

Next, a case where the voltage applied to the diode 120 is equal to or greater than the reference voltage will be described.

As described above, if the voltage applied to the diode 120 is greater than or equal to the reference voltage, the operation state of the FET 130 may be a turn-on state. That is, the current output from the battery module 110 may flow from drain terminal D of the FET 130 toward the source terminal S.

In this case, the current output from the battery module 110 may be applied to the first base terminal B1 and the first emitter terminal E1 of the first transistor 140. In addition, the current output from the battery module 110 may not be applied to the second base terminal B2. That is, even though the emitter and the collector of the first transistor 140 conduct electricity, the emitter and the collector of the second transistor 150 may not conduct electricity.

For example, in the embodiment of FIG. 2, if the voltage of the battery module 110 is greater than or equal to the reference voltage, a current flows in a reverse direction of the diode 120, so the operation state of the FET 130 may be shifted to a turn-on state.

That is, the second transistor 150 may be configured so that the second emitter terminal E2 and the second collector terminal C2 conduct electricity only when the voltage of the battery module 110 is smaller than the reference voltage.

Therefore, if the voltage of the battery module 110 is equal to or greater than the reference voltage, the current output from the battery module 110 may flow only through the first current path P1 connected to the first transistor 140.

As such, since the battery pack 100 according to an embodiment of the present disclosure may include a plurality of current paths, the current of the battery module 110 may flow through a current path corresponding to the voltage of the battery module 110. Accordingly, according to the battery pack 100, since a current path corresponding to an input voltage range is automatically selected, there is an advantage of providing a battery pack 100 compatible with an input of a wide voltage range.

The battery pack 100 according to an embodiment of the present disclosure may further include a first resistor R1 disposed between the diode 120 and the negative electrode terminal of the battery module 110.

In this case, the FET 130 may be configured so that the gate terminal G is connected between the first resistor R1 and the diode 120.

For example, in the embodiment of FIG. 2, one end of the first resistor R1 may be connected to the other end of the diode 120, and the other end of the first resistor R1 may be connected between the negative electrode terminal of the battery module 110 and the negative electrode terminal P− of the battery pack 100. In addition, the gate terminal G of the FET 130 may be connected between the other end of the diode 120 and one end of the first resistor R1.

That is, if the voltage of the battery module 110 is equal to or greater than the reference voltage, the first resistor R1 may be disposed in the battery pack 100 to prevent a current flowing in a reverse direction of the diode 120 from flowing toward the negative electrode terminal of the battery module 110. Therefore, if the voltage of the battery module 110 is equal to or greater than the reference voltage, the voltage of the battery module 110 may be applied to the gate terminal G of the FET 130 so that the operation state of the FET 130 is shifted to a turn-on state.

The battery pack 100 according to an embodiment of the present disclosure may further include a second resistor R2 disposed between the diode 120 and the drain terminal D of the FET 130.

In this case, the second transistor 150 may be configured so that the second collector terminal C2 is connected between the diode 120 and the second resistor R2.

For example, in the embodiment of FIG. 2, one end of the second resistor R2 may be connected to one end of the diode 120. Specifically, one end of the second resistor R2 may be connected between one end of the diode 120 and the second collector terminal C2.

In addition, the other end of the second resistor R2 may be connected to the drain terminal D of the FET 130. In addition, the first base terminal B1 of the first transistor 140 may be connected between the other end of the second resistor R2 and the drain terminal D of the FET 130.

The battery pack 100 according to an embodiment of the present disclosure may further include a third resistor R3 disposed between the second resistor R2 and the first base terminal B1 of the first transistor 140.

In this case, the FET 130 may be configured so that the drain terminal D is connected between the second resistor R2 and the third resistor R3. In addition, the second transistor 150 may be configured so that the second base terminal B2 is connected between the drain terminal D and the third resistor R3.

For example, in the embodiment of FIG. 2, one end of the third resistor R3 may be connected to the other end of the second resistor R2, and the other end of the third resistor R3 may be connected to the first base terminal B1 of the first transistor 140. In addition, the drain terminal D of the FET 130 may be connected between the other end of the second resistor R2 and one end of the third resistor R3. In addition, the second base terminal B2 of the second transistor 150 may be connected between the drain terminal D of the FET 130 and one end of the third resistor R3. In addition, the second base terminal B2 may be connected between the other end of the second resistor R2 and one end of the third resistor R3.

Preferably, the first resistor R1, the second resistor R2 and the third resistor R3 may be configured to have the same resistance.

Figure 3:
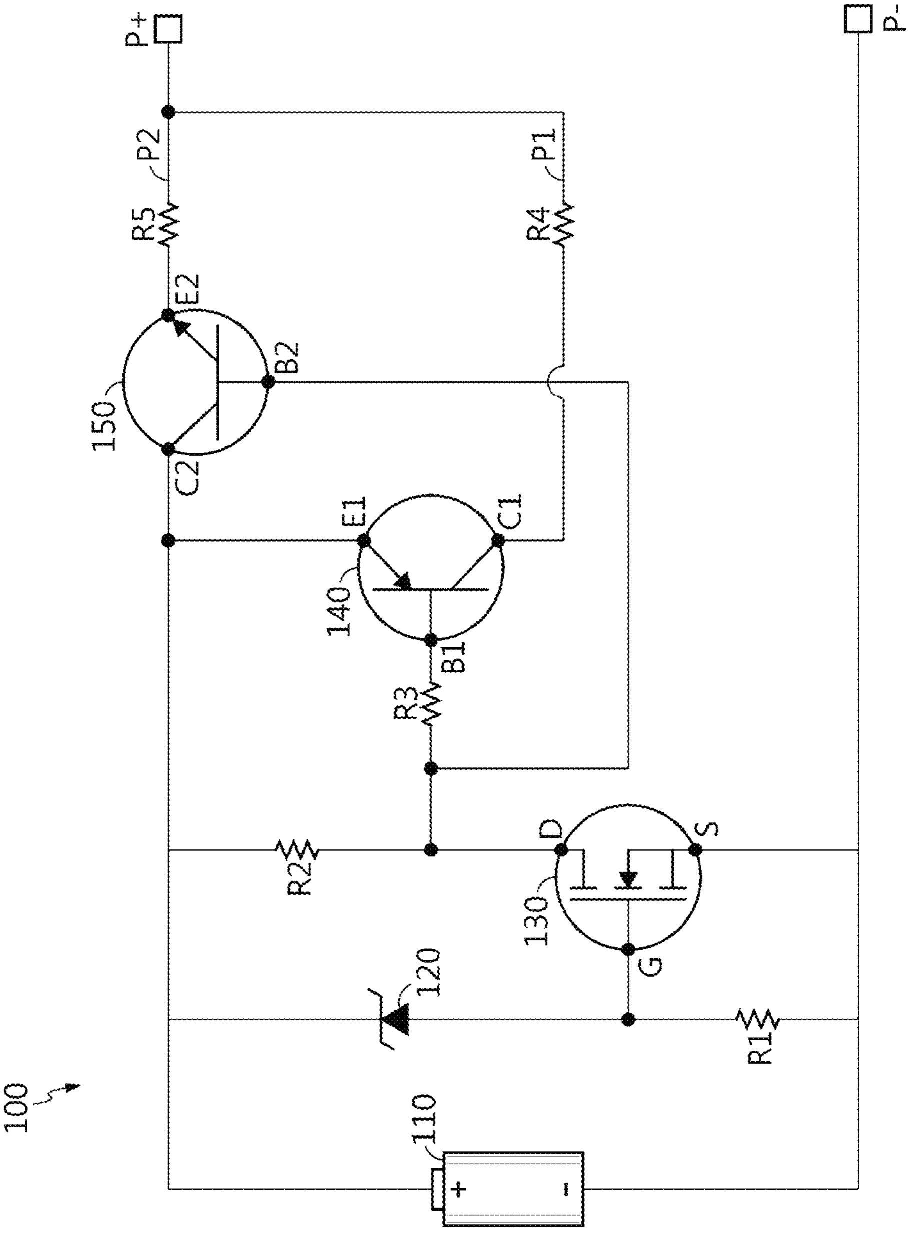
FIG. 3 is a diagram schematically showing an exemplary configuration of a battery pack according to another embodiment of the present disclosure.

FIG. 3 is a diagram schematically showing an exemplary configuration of a battery pack according to another embodiment of the present disclosure. Hereinafter, a configuration of the battery pack 100 described above will not be described again, and a configuration added to the battery pack 100 according to another embodiment of the present disclosure will be described.

The battery pack 100 according to another embodiment of the present disclosure may further include a fourth resistor R4 disposed between the first collector terminal of the first transistor 140 and the positive electrode terminal P+ of the battery pack 100.

Specifically, the fourth resistor R4 may be a resistor for dropping the voltage applied to the load connected to the battery pack 100 through the first transistor 140.

That is, the first current path P1 is a path through which a current may flow not only when the voltage of the battery module 110 is smaller than the reference voltage but also when the voltage of the battery module 110 is equal to or greater than the reference voltage. Therefore, the battery pack 100 including the fourth resistor R4 provided at the first collector terminal C1 of the first transistor 140 may prevent overvoltage from being applied to the load.

In addition, the battery pack 100 may further include a fifth resistor R5 having a smaller resistance than the fourth resistor R4 and disposed between the second emitter terminal E2 of the second transistor 150 and the positive electrode terminal P+ of the battery pack 100.

Specifically, the fifth resistor R5 may be a resistor for dropping the voltage applied to the load connected to the battery pack 100 through the second transistor 150.

However, the second current path P2 is a path through which a current may flow only when the voltage of the battery module 110 is smaller than the reference voltage. Therefore, the resistance of the fifth resistor R5 may be smaller than the resistance of the fourth resistor R4.

That is, since the battery pack 100 includes a plurality of current paths through which the current output from the battery module 110 may flow and also includes a resistor corresponding to the voltage applied to each current path, there is an advantage of applying a voltage of a certain size range to the load. Therefore, it may be prevented that a voltage excessively higher or lower than necessary is applied to the load.

For example, if an opto-coupler is connected to the battery pack 100, the opto-coupler may be operated when a current corresponding to a predetermined current range is applied. That is, since the battery pack 100 includes a plurality of current paths, there is an advantage of supplying a current corresponding to a current range required by the connected load.

Figure 4:
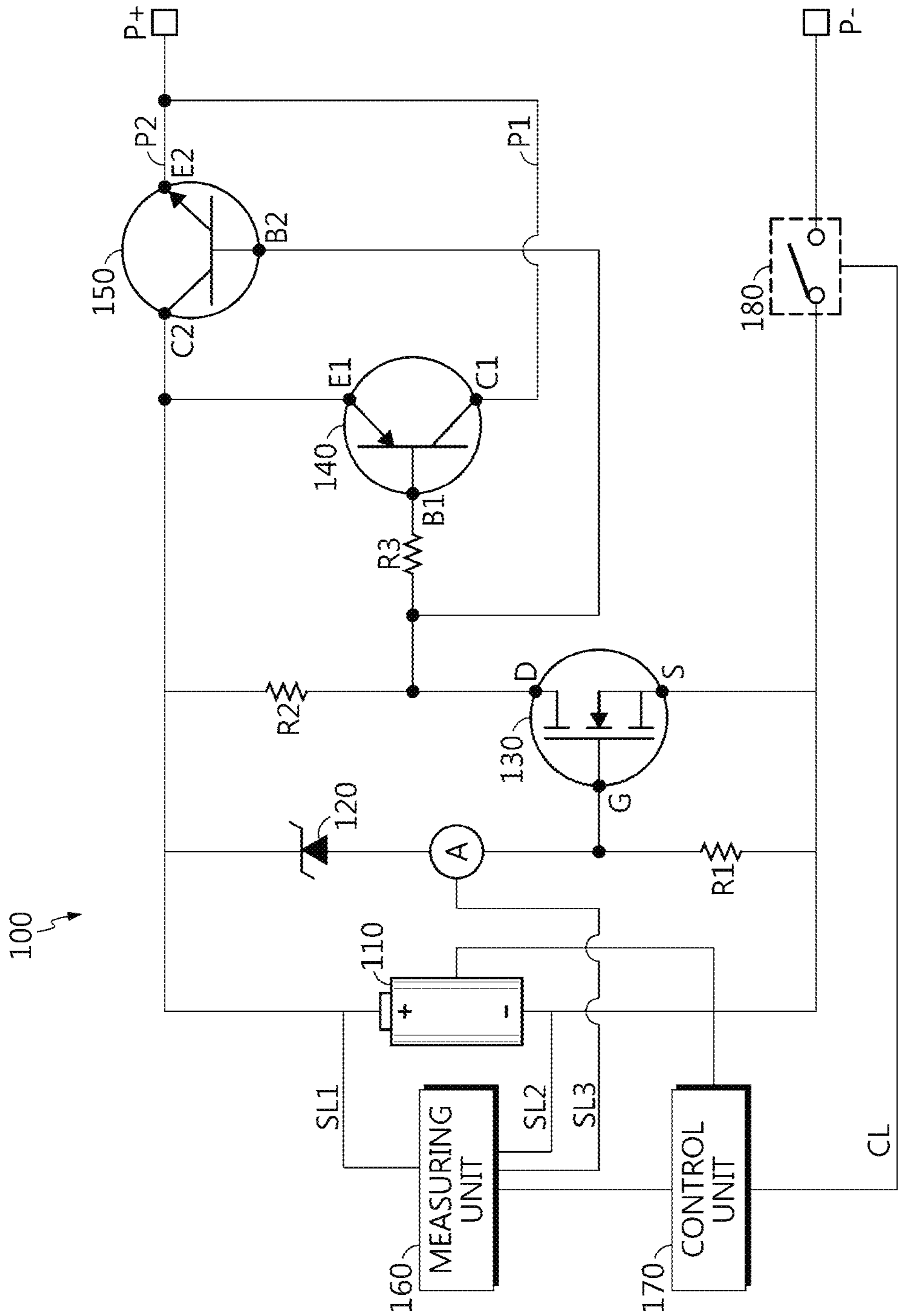
FIG. 4 is a diagram schematically showing an exemplary configuration of a battery pack according to still another embodiment of the present disclosure.

FIG. 4 is a diagram schematically showing an exemplary configuration of a battery pack according to still another embodiment of the present disclosure.

Referring to FIGS. 1 and 4, a battery pack 100 according to still another embodiment of the present disclosure may further include a measuring unit 160, a control unit 170, and a main relay 180.

The main relay 180 may be configured to be connected in series to one end of the battery module 110.

Specifically, the main relay 180 may be disposed on a main charging and discharging path of the battery pack 100. Here, the main charging and discharging path may be a large current path through which the current output from the battery module 110 or the current applied to the battery module 110 flows.

For example, in the embodiment of FIG. 4, the main relay 180 may be disposed between the negative electrode terminal of the battery module 110 and the negative electrode terminal P− of the battery pack 100.

The measuring unit 160 may be configured to measure the voltage of the battery module 110.

Specifically, the measuring unit 160 may measure the voltage of the battery module 110 by measuring voltages at both ends of the battery module 110 and calculating a difference between the measured voltages at both ends.

For example, in the embodiment of FIG. 4, the measuring unit 160 may be connected to the positive electrode terminal of the battery module 110 through a first sensing line SL1. In addition, the measuring unit 160 may be connected to the negative electrode terminal of the battery module 110 through a second sensing line SL2. The measuring unit 160 may measure the voltage of the battery module 110 by calculating a difference between the positive electrode voltage of the battery module 110 measured through the first sensing line SL1 and the negative electrode voltage of the battery module 110 measured through the second sensing line SL2.

In addition, the measuring unit 160 may be configured to measure a current flowing between the diode 120 and the FET 130.

To this end, an ampere meter may be further provided at the other end of the diode 120. The measuring unit 160 may measure the current flowing at the other end of the diode 120 by means of the ampere meter.

For example, in the embodiment of FIG. 4, an ampere meter may be further provided between the other end of the diode 120 and one end of the first resistor R1. In this case, the gate terminal G of the FET 130 may be connected between the ampere meter and the first resistor R1.

The measuring unit 160 may be connected to the ampere meter through a third sensing line SL3 and measure the current flowing at the other end of the diode 120 through the third sensing line SL3.

In addition, the measuring unit 160 may be configured to output the measured voltage and current values.

For example, referring to FIG. 4, the measuring unit 160 may conduct electricity to the control unit 170. In addition, the measured voltage and current values may be converted into a digital signal, and the converted digital signal may be output to the control unit 170.

The control unit 170 may be connected to the battery module 110. In addition, the control unit 170 may control an output voltage of the battery module 110 by controlling a connection relationship among the plurality of battery cells included in the battery module 110. That is, the control unit 170 may adjust the output voltage of the battery module 110 by connecting the plurality of battery cells included in the battery module 110 in series and/or in parallel.

For example, it is assumed that fourteen 4.5 [V] battery cells are included in the battery module 110. The control unit 170 may adjust the output voltage of the battery module 110 to 4.5 [V] by connecting all of the plurality of battery cells included in the battery module 110 in parallel. As another example, the control unit 170 may adjust the output voltage of the battery module 110 to 63 [V] by connecting all of the plurality of battery cells included in the battery module 110 in series. In addition, the control unit 170 may adjust the magnitude of the output voltage of the battery module 110 by connecting the plurality of battery cells included in the battery module 110 in series and/or in parallel.

The control unit 170 may be configured to receive the voltage and current values measured by the measuring unit 160.

The control unit 170 may obtain the voltage value of the battery module 110 and the current value flowing through the other end of the diode 120, measured by the measuring unit 160, by reading the digital signal received from the measuring unit 160.

In addition, the control unit 170 may be configured to control the operation state of the main relay 180 based on the received voltage and current values.

Specifically, the control unit 170 may be connected to the main relay 180 and output an operation state control command capable of shifting the operation state of the main relay 180 to a turn-on state or a turn-off state.

For example, if the control unit 170 outputs a turn-on state control command, the operation state of the main relay 180 may be shifted to a turn-on state or maintained in a turn-on state. Conversely, if the control unit 170 outputs a turn-off state control command, the operation state of the main relay 180 may be shifted to a turn-off state or maintained in a turn-off state.

In the embodiment of FIG. 4, the control unit 170 may be connected to the main relay 180 through a control line CL. In addition, the control unit 170 may control the operation state of the main relay 180 by outputting a turn-on state control command through the control line CL.

In this case, the control unit 170 may control the operation state of the main relay 180 based on the voltage value of the battery module 110 and the current value flowing through the other end of the diode 120, measured by the measuring unit 160.

Specifically, the control unit 170 may be configured to calculate a power consumption of the diode 120 based on the received voltage and current values.

Here, the power consumption of the diode 120 may mean a power consumed by the diode 120 when a voltage equal to or greater than the reference voltage is applied to the diode 120 so that a current flows in a reverse direction of the diode 120.

For example, the power consumption may be calculated according to the following equation.

$$Pz = Vz \times Iz \quad \text{[Equation]}$$

Here, Pz is the power consumption [W] of the diode 120, Vz is the voltage [V] applied to the diode 120, and Iz is the current [A] flowing in a reverse direction of the diode 120.

For example, if the voltage of the battery module 110 is smaller than the reference voltage, a current may not flow in a reverse direction of the diode 120. Therefore, in this case, the power consumption of the diode 120 is 0 [W].

As another example, if the voltage of the battery module 110 is greater than or equal to the reference voltage, a current may flow in a reverse direction of the diode 120. Here, assuming that the internal resistance of the diode 120 is negligibly small, the voltage of the battery module 110 may be the same as the voltage of both ends of the diode 120. Accordingly, the control unit 170 may calculate the power consumption (Pz) of the diode 120 based on the voltage value (Vz) and the current value (Iz) received from the measuring unit 160.

In addition, if the calculated power consumption is greater than or equal to a maximum allowable power of the diode 120, the controller may be configured to control the operation state of the main relay 180 to a turn-off state.

Here, the maximum allowable power of the diode 120 means a threshold power at which the diode 120 may be damaged.

If the power consumption of the diode 120 is smaller than the maximum allowable power, when the voltage application is terminated, the diode 120 may return to its original state. Meanwhile, if the power consumption of the diode 120 is equal to or greater than the maximum allowable power, the diode 120 cannot return to its original state even when the voltage application is terminated. That is, in this case, the diode 120 may be damaged.

In the embodiment of FIG. 4, it is assumed that the diode 120 is damaged so that a current can flow in a reverse direction of the diode 120 at all times. In this case, if a load is connected to the battery pack 100, the operation state of the FET 130 may be a turn-on state at all times. That is, the current output from the battery module 110 may flow through the first transistor 140 and may not flow through the second transistor 150. Accordingly, if the diode 120 is damaged, there is a problem that the plurality of current paths included in the battery pack 100 cannot be used according to a corresponding voltage.

To prevent this problem, the control unit 170 may determine whether the diode 120 is damaged by comparing the power consumption of the diode 120 with the maximum allowable power.

If it is determined that the diode 120 is damaged (the power consumption is equal to or greater than the maximum allowable power), the control unit 170 may be configured to block the electrical connection between the battery pack 100 and the battery module 110 by controlling the operation state of the main relay 180 to a turn-off state.

That is, even if the diode 120 is damaged, the current output from the battery module 110 may flow to the load through the first current path P1. However, the current output from the battery module 110 cannot flow to the load through the second current path P2.

Therefore, since it is not possible to determine a defective state of the battery pack 100 only by whether or not a current is applied to the load, the battery pack 100 according to still another embodiment of the present disclosure has an advantage of determining whether a defect occurs at the battery pack 100 based on the power consumption of the diode 120.

Meanwhile, the control unit 170 included in the battery pack 100 according to still another embodiment of the present disclosure may optionally include a processor, an application-specific integrated circuit (ASIC), another chipset, a logic circuit, a register, a communication modem, and a data processing device, and the like, known in the art to execute various control logics disclosed below. In addition, when the control logic is implemented in software, the control unit 170 may be implemented as a set of program modules. At this time, the program module may be stored in a memory and executed by the control unit 170. The memory may be provided in or out of the control unit 170, and may be connected to the control unit 170 by various well-known means.

In addition, the battery pack 100 according to still another embodiment of the present disclosure may further include a communication unit and/or a display unit capable of providing to the outside whether or not the diode 120 is damaged.

The communication unit may be controlled by the control unit 170. In addition, if the control unit 170 determines that the diode 120 is damaged, the communication unit may be configured to output information about the damage of the diode 120 to the outside. Therefore, a user may receive the information on the damage of the diode 120 from the communication unit and check the battery pack 100.

The display unit may be configured to provide the information about the damage of the diode 120 to the user by means of sound, image, text, figure, or the like. The user may visually and/or audibly acquire the information about the damage of the diode 120 through the display unit.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

100: battery pack
110: battery module
120: diode
130: FET
140: first transistor
150: second transistor
160: measuring unit
170: control unit
180: main relay

What is claimed is:

1. A battery pack including a plurality of current paths, comprising:

a battery module comprising one or more battery cells;

a diode disposed such that a direction toward a positive electrode of the battery module is a positive direction, the diode being connected in parallel with the battery module;

a FET (Field Effect Transistor) comprising a gate terminal, a drain terminal, and a source terminal, connected in parallel with the diode through the drain terminal and the source terminal and connected to the other end of the diode through the gate terminal, the FET being configured to receive an operation voltage from the battery module through the diode;

a first transistor comprising a first base terminal, a first emitter terminal, and a first collector terminal, the first base terminal being connected to the drain terminal, the first emitter terminal and the first collector terminal being connected to a positive electrode terminal of the battery module; and a second transistor comprising a second base terminal, a second emitter terminal, and a second collector terminal, the second base terminal being connected between the drain terminal and the first base terminal, the second collector terminal being connected to the first emitter terminal, the second collector terminal being disposed between the first emitter terminal and the first collector terminal, and the second emitter terminal being connected to the first collector terminal, wherein the first emitter terminal is connected between the positive electrode terminal of the battery module and the second collector terminal of the second transistor.

2. The battery pack including a plurality of current paths according to claim 1, wherein the diode is configured to conduct electricity when a voltage equal to or greater than a reference voltage is applied thereto from the battery module.

3. The battery pack including a plurality of current paths according to claim 2, wherein the FET is further configured such that an operation state thereof is shifted to a turn-on state only when a voltage equal to or greater than the reference voltage is applied to the diode.

4. The battery pack including a plurality of current paths according to claim 2, wherein the second transistor is configured so that the second emitter terminal and the second collector terminal conduct electricity only when the voltage of the battery module is smaller than the reference voltage.

5. The battery pack including a plurality of current paths according to claim 2, further comprising:

a main relay connected in series to one end of the battery module;

a measuring unit configured to:

measure a voltage of the battery module;

measure a current flowing between the diode and the FET; and output the measured voltage and current values; and a control unit configured to:

receive the measured voltage and current values from the measuring unit; and control an operation state of the main relay, based on the received voltage and current values.

6. The battery pack including a plurality of current paths according to claim 5, wherein the control unit is further configured to:

calculate a power consumption of the diode based on the received voltage and current values; and control the operation state of the main relay to a turn-off state when the calculated power consumption is equal to or greater than a maximum allowable power of the diode.

7. The battery pack including a plurality of current paths according to claim 6, wherein the control unit is further configured to block the electric connection between the battery pack and the battery module by controlling the operation state of the main relay to a turn-off state.

8. The battery pack including a plurality of current paths according to claim 1, further comprising:

a first resistor between the diode and a negative electrode terminal of the battery module, wherein the gate terminal is connected between the first resistor and the diode.

9. The battery pack including a plurality of current paths according to claim 8, further comprising:

a second resistor between the diode and the drain terminal of the FET, wherein the second collector terminal is connected between the diode and the second resistor.

10. The battery pack including a plurality of current paths according to claim 9, further comprising:

a third resistor between the second resistor and the first base terminal of the first transistor, wherein the drain terminal is connected between the second resistor and the third resistor, and wherein the second base terminal is connected between the drain terminal and the third resistor.

11. The battery pack including a plurality of current paths according to claim 1, further comprising:

a fourth resistor between the first collector terminal of the first transistor and a positive electrode terminal of the battery pack; and a fifth resistor having a smaller resistance than the fourth resistor, the fifth resistor being between the second emitter terminal of the second transistor and the positive electrode terminal of the battery pack.

* * * * *